United States Patent
Fukuda et al.

(10) Patent No.: US 8,207,498 B2
(45) Date of Patent: Jun. 26, 2012

(54) ELECTRON BEAM APPARATUS AND ELECTRON BEAM INSPECTION METHOD

(75) Inventors: Muneyuki Fukuda, Kokubunji (JP); Tomoyasu Shojo, Kokubunji (JP); Mitsugu Sato, Hitachinaka (JP); Atsuko Fukada, Kokubunji (JP); Naomasa Suzuki, Hitachinaka (JP); Ichiro Tachibana, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 12/985,633

(22) Filed: Jan. 6, 2011

(65) Prior Publication Data
US 2011/0101223 A1 May 5, 2011

Related U.S. Application Data

(63) Continuation of application No. 11/877,715, filed on Oct. 24, 2007, now Pat. No. 7,875,849.

(30) Foreign Application Priority Data

Oct. 26, 2006 (JP) ................................ 2006-290772

(51) Int. Cl.
*H01J 37/28* (2006.01)
(52) U.S. Cl. ...................................... 250/306; 250/310
(58) Field of Classification Search ................... 250/306, 250/310
See application file for complete search history.

(56) References Cited

U.S. PATENT DOCUMENTS

| 5,644,132 | A | 7/1997 | Litman et al. |
| 6,501,077 | B1 | 12/2002 | Sawahata et al. |
| 7,365,324 | B2 * | 4/2008 | Noji et al. ..................... 250/310 |
| 2006/0186351 | A1 | 8/2006 | Nishiyama et al. |

FOREIGN PATENT DOCUMENTS

| JP | 08-273569 | 10/1996 |
| JP | 2006-228999 | 8/2006 |
| WO | WO 00/19482 | 4/2000 |

\* cited by examiner

*Primary Examiner* — Kiet T Nguyen
(74) *Attorney, Agent, or Firm* — Antonelli, Terry, Stout & Kraus, LLP.

(57) ABSTRACT

An electron beam apparatus which includes a sample stage on which a sample is placed, and an electron optical system. The electron optical system includes an electron gun that generates a primary electron beam, an immersion objective lens that converges the primary electron beam on the sample, an ExB deflector that separates a secondary particle, which is generated from irradiation of the primary beam to the sample, from an optical axis of the primary beam, a reflecting member to which the secondary particle collides, an assist electrode which is located under the reflecting member, a plurality of incidental particle detectors that selectively detect a velocity component and an azimuth component of a ternary particle which is generated by the secondary particle colliding to the reflecting member, and a center detector that is located above the reflecting member.

2 Claims, 15 Drawing Sheets

ELEVATION ANGLE AT GENERATIONAL POSITION
WHERE SECONDARY ELECTRONS IS GENERATED

| BEAM MODE SELECTING CONDITION | | VOLTAGE VALUE | |
|---|---|---|---|
| MAJOR CATEGORY | MINOR CATEGORY | Vb | Vc |
| INSPECTION MODE | NORMAL MODE | 5kV | −800 |
| | CHARGE MODE | 3kV | −500 |
| OBSERVATION MODE | NORMAL MODE | 2kV | −300 |
| | CHARGE MODE | 1kV | −100 |

FIG.8A WITH ASSIST ELECTRODE

FIG.8B WITHOUT ASSIST ELECTRODE

SECONDARY ELECTRON ENERGY

FIG.15A

| BEAM MODE SELECTING CONDITION | | VOLTAGE VALUE | | | | |
|---|---|---|---|---|---|---|
| MAJOR CATEGORY | MINOR CATEGORY | Vst | Vb | Vc | Vre | Vsc |
| INSPECTION MODE | NORMAL MODE | −5kV | 5kV | −800 | −200 | 9.8kV |
| | CHARGE MODE | −6kV | 1kV | −500 | −100 | 9.9kV |
| OBSERVATION MODE | NORMAL MODE | −5kV | 0kV | −300 | 0 | 10kV |
| | CHARGE MODE | −6kV | 0kV | −100 | 0 | 10kV |

FIG.15B

| BEAM MODE SELECTING CONDITION | | ELECTRON OPTICAL SYSTEM SETTING VALUES | | |
|---|---|---|---|---|
| MAJOR CATEGORY | MINOR CATEGORY | OBJECTIVE LENS | STIGMA COIL | ALIGNER |
| INSPECTION MODE | NORMAL MODE | 3A | (−2,1) | (2,1) |
| | CHARGE MODE | 2A | (3,−3) | (1,−2) |
| OBSERVATION MODE | NORMAL MODE | 2A | (1,−2) | (3,1) |
| | CHARGE MODE | 1A | (−2,1) | (−1,−2) |

ELECTRON BEAM APPARATUS AND ELECTRON BEAM INSPECTION METHOD

CROSS REFERENCE TO RELATED APPLICATION

This application is a continuation of U.S. application Ser. No. 11/877,715, filed Oct. 24, 2007, now U.S. Pat. No. 7,875,849, the contents of which are incorporated herein by reference.

CLAIM OF PRIORITY

The present invention claims priority from Japanese application JP 2006-290772, filed on Oct. 26, 2006, the content of which is hereby incorporated by reference on to this application.

BACKGROUND OF THE INVENTION

1. Field of the Invention

The present invention relates to a technology for manufacturing a substrate comprised of a very tiny circuit pattern, such as a semiconductor devices and a liquid crystal. More particularly, the present invention relates to a charged-particle beam inspection technology for inspecting the tiny circuit pattern using a charged-particle beam.

2. Description of the Related Art

Semiconductor devices are fabricated by repeating a step of transferring a pattern, which is formed on a wafer using a photo mask, through lithography or etching. In such a fabrication process, for quick boost of a yield and realization of stable running of the fabrication process, it is a must to quickly analyze a defect, which is discovered by performing in-line wafer inspection, for the purpose of taking measures on the basis of the results of the analysis. In order to link the results of the inspection to a countermeasure to defectives, a technology for quickly reviewing numerous detected defects and classifying them by a cause is needed.

However, due to the decrease of a design rule of semiconductor manufacturing process, the size of a defect affecting a fabrication yield of a semiconductor device is decreasing. A conventional optical review apparatus has difficulty in reviewing and classifying microscopic defects because of an insufficient resolution. Consequently, a scanning electron microscope (SEM) type review apparatus capable of reviewing defects at a high resolution has come to be adopted. In the review apparatus, acquisition of a shadow image based on an SEM image which is equivalent to a shadow caused by light incident from side of an object to be reviewed is important in detecting a roughness such as a microscopic foreign matter or a scratch.

A general principle for acquisition of the shadow image will be described in conjunction with FIG. 1. When an roughness 1 caused by a foreign matter included in a film is scanned with an electron beam 2, a secondary particle 3 is emitted from each irradiated point on a sample. The generated secondary particle 3 has a distribution with respect to the energy. A component of a relatively low energy (low-velocity component) is referred to as a secondary electron (SE), while a component of a relatively high energy (high-velocity component) is referred to as a backscattering electron (BSE). As indicated with arrows 6 in FIG. 1, a secondary particle at a generational position at which the secondary particle is generated has elevation-angle components oriented in various directions. Here, the elevation angle of a secondary particle at a generational position means an angle formed by each elevation-angle component of the secondary particle with respect to a plane to which the optical axis of an irradiated primary electron beam is normal. As far as a certain elevation-angle component 6 of a secondary particle at a generational position is concerned, components of the secondary particle emitted rightward reach a detector 4 but components thereof emitted leftward do not reach the detector. Therefore, the quantity of a secondary electron detected by the detector 4 varies depending on a level of a slope 5 of a sample surface at the generational position of a secondary particle. Consequently, a shadow contrast depending on an roughness on a sample surface is appeared in a shadow image 7 obtained by the detector.

Disclosed in Japanese Patent Application Laid-Open No. 8-273569 is an invention relating to a charged-particle beam column in which a secondary charged particle detection optical system using a magnetic/electrostatic compound objective lens, accuracy of measurement is improved by detecting a low-velocity component (SE) and a high-velocity component (BSE) in a secondary particle distinctively. In the invention disclosed in the publication, an annular detector disposed between an electron source and an objective lens is utilized, and the backscattering electron is detected in an internal annular zone of the annular detector, and the secondary electron is detected in an external annular zone of the annular detector, on the basis of the fact that trajectories of the low-velocity component and high-velocity component of a secondary particle are different, thus the separation and detection of the secondary particle is achieved by. The external annular zone is divided into four sectors so that a specific azimuth component of a secondary electron at a position from which the secondary electron is emitted can be distinguished. Consequently, a shadow image can be acquired.

On the other hand, disclosed in PCT Publication No. WO00/19482 is a configuration for distinguishing and detecting a low-angle component and a high-angle component of a secondary particle. In the invention disclosed in the publication, a secondary particle detector for detecting the low-angle component is disposed above an objective lens, and a reflector to which the low-angle component of a generated secondary particle collides is disposed between the low-angle component detector and objective lens. Further, an incidental particle generated from the collision of the low-angle component is introduced into the low-angle component detection secondary particle detector using an ExB deflector, whereby the low-angle component of a reflected electron and a secondary electron are detected. For the high-angle component of the reflected electron, another high-angle component detection secondary particle detector and a second ExB deflector are disposed above the ExB deflector (on the side of the electron source) so that the high-angle component detector can detect the high-angle component alone.

Moreover, disclosed in Japanese Patent Application Laid-Open No. 2006-228999 is an electron microscope in which an annular detector is disposed between an electron source and an objective lens so that a low-elevation angle component and a high-elevation angle component of a generated secondary electron can be separated from each other and an azimuth component can be separated from the secondary electron.

SUMMARY OF THE INVENTION

A secondary particle generated from irradiation of an electron beam can be discriminated into four types in terms of an elevation angle at the generational position (low-angle component and high-angle component), and an energy (high-velocity component and high-velocity component), that is, a low-angle and low-velocity component, a low-angle and high-velocity component, a high-angle and low-velocity component, and a high-angle and high-velocity component. Out of the secondary particle, the high-velocity component contains substantial information according to the shape of the generational position of the secondary particle. On the other hand, the low-velocity component contains substantial information according to the interior of a sample within a range corresponding to a penetration depth of a primary beam (for example, the material of the sample, the composition thereof, and so on). Consequently, if a secondary particle generated from irradiation of a primary beam were distinguished and detected into a low-velocity component and a high-velocity component in order to form an image, it would be advantageous in observation of a sample. An image formed based on the high-velocity component may be referred to as a shadow image.

In the conventional arts described in Japanese Patent Application Laid-Open No. H8-273569, PCT Publication No. WO00/19482, and Japanese Patent Application Laid-Open No. 2006-228999, a secondary particle can be detected in a low-angle component and a high-angle component distinctively. However, out of a high-velocity component of the secondary particle, a high elevation angle component at the generational position of the secondary particle cannot be sufficiently separated from a low-velocity component. As a result, a shadow image lacks the high-velocity high-elevation angle component, and the intensity of the contrast of the shadow image is reduced than an potentially obtainable value. This causes a problem that a figure with a roughness of small degree (shallow) does not appear in a shadow image.

Further, since only a weak contrast shadow image is obtained, image data has to be integrated many times in order to ensure a satisfactory signal-to-noise ratio for the image. Consequently, a qualified image for the inspection or measurement of a sample cannot be acquired in a short time. If a beam current of the primary beam is increased, an image signal with a high signal-to-noise ratio can be obtained. However, an increase of a beam current leads to an increase in a beam diameter, resulting degradation in the resolution of an image.

Accordingly, an object of the present invention is to provide a charged-particle beam inspection technology capable of acquiring an image in which shadow contrast is more enhanced than a conventional one, in shorter time than that required conventionally.

In the present invention, the above object is accomplished by providing trajectory separating means for separating the trajectory of a low-velocity component and a high-energy component of a secondary particle each other, generated by an irradiation of a primary electron beam. A fundamental principle for the separation of the trajectories will be described below.

FIG. 2 shows an energy distribution of an emission density of a secondary particle emitted from a sample. In the drawing, the vertical axis indicates the emission density of a secondary particle, and the horizontal axis of indicates the energy of the secondary particle. The energy of the secondary particle are distributed within a range from 0 to a value corresponding to the energy of an irradiated primary beam (Vp). The emission density shows two peaks in the low energy side and the high energy side, the low energy side peak 10 corresponds to a secondary electron, and the low energy side peak 11 corresponds to energy a backscattering electron. Hereinafter, the peak 10 signifying the secondary electron and the peak 11 signifying the backscattering electron shall be regarded as the representative value of a low-velocity component and a high-velocity component of a secondary particle at a generational position of the secondary electron. Herein, as seen from FIG. 2, since the distribution energy of the secondary electron and the distribution energy of the backscattering electron has a tail in both the higher and lower energy side respectively, it is impossible to strictly discriminate the secondary electron and the backscattering electron from each other. Therefore, the "high-velocity component" or "low-velocity component" appeared in the following description, they signify a distribution of secondary particle in which the peak 10 or peak 11 is major content as shown in FIG. 2. If necessary, the term "secondary electron" or "backscattering electron" will be employed.

FIG. 3 shows the results of simulation indicating an effect of a magnetic field to a secondary electron (SE) and a backscattering electron (BSE) in passing through an objective lens, that is, the relationship between rotational angles of the secondary electron 20 and backscattering electron 21 rotated by the magnetic field, and elevation angles of the secondary electron 20 and backscattering electron 21 exhibits at a generational position of a secondary particle. In the drawing, the vertical axis indicates rotational angle, and the horizontal axis indicates elevation angle at the generational position of a secondary particle. Because the secondary electron 20 and backscattering electron 21 are emitted from a sample in specific directions, each of the secondary electron 20 and backscattering electron 21 have proper velocity vectors at the generational position. The velocity vector can be expressed with the azimuth, elevation angle, and energy of the secondary electron 20 or backscattering electron 21. In a case of an objective lens is a lens utilizing a magnetic field, the secondary electron 20 and backscattering electron 21 pass through the objective lens with rotating spirally in the magnetic field. An rotational angle caused by a magnetic field varies depending on the energy of a secondary particle. Consequently, in a case that the degree of rotation is large, information on an azimuth angle included in a secondary particle at the generational position thereof is lost, so that the discrimination of an azimuth angle component of each secondary particle becomes impossible. Referring to FIG. 3, in a case that the elevation angle at the generational position is the same in the secondary electron and backscattering electron, the rotational angle of the secondary electron 20 is larger than that of the backscattering electron 21. Consequently, it is harder to enhance a shadow contrast in a secondary-electron image than that in a backscattering-electron image.

On the other hand, since the degree of the rotational angle of the backscattering electron 21 depending on the elevation angle is smaller than that of the secondary electron, a shadow contrast of an image produced based on the backscattering electron can be enhanced. Generally, the contrast of an observation image of a shallow roughness or a tiny foreign matter is weak. If the shallow roughness is observed in a way of enhancing the shadow, newly generated contrast is added to the shallow roughness, so that the contrast is enhanced. The newly generated contrast shall be referred to as a shadow contrast. Small rotational angle of a secondary particle enables to distinguish the azimuth angle component, thus the shadow contrast increases. Thus, by detecting a high-velocity component with a wide range in the elevation angle at a generational position, and distinguishing into the azimuth component, the shadow contrast is enhanced. Consequently, the shallow roughness or tiny foreign matter can be detected with high sensitivity.

Next, referring to FIG. 4 and FIG. 5, a method for separating a high-velocity component of a secondary particle from a low-velocity component thereof and controlling the ratio of separation will be described below.

FIG. 4 shows the trajectory of a secondary particle in an electron optical system with insufficient separation of the high-velocity component and the low-velocity component of the secondary particle. For simplicity, the optical axis 33 of an electron beam is regarded as perpendicular to a sample 32. In facing to the sample 32, a magnetic/electrostatic compound objective lens 31 is disposed. The magnetic/electrostatic compound objective lens 31 is composed of a coil 34 and an electrode 35. The potential difference between the sample 32 and electrode 35 is retained in a range from +1 kV to +50 kV. A left reflector 36 and a right reflector 37 are disposed on a opposite side to the sample 32 with respect to the magnetic/electrostatic compound objective lens 31. A left detector 42 and a right detector 43 for the backscattering electron are disposed on both side of the left reflector 36 and right reflector 37 respectively. Though not depicted, detector for the secondary electron is disposed above the left reflector 36 and right reflector 37. A negative voltage is applied to each of the left reflector 36 and right reflector 37. The potential difference of the left reflector 36 and right reflector 37 to the electrode 35 is from 0 V to −50 kV.

A secondary particle generated by the irradiation with the primary beam is accelerated by an electric field induced by the electrode 35 in passing through the magnetic/electrostatic compound objective lens 31. At this time, both high-angle and low-angle components of a secondary electron contained in a secondary particle pass through an opening formed in the reflectors. On the other hand, a low-angle component of a backscattering electron traces a trajectory 39 deviated from the optical axis. As to the high-angle component of the backscattering electron, the high-angle component passes through the opening in the reflectors before sufficiently moving on an XY plane (that is, without spreading the trajectory to lateral direction), because the backscattering electron has originally high energy (that is, a high velocity). In other words, the high-velocity component of the backscattering electron is not detected by the backscattering electron detectors 42 and 43, which should detect the high-velocity component potentially. Further, in the case that the trajectory 38 of the low-angle component of the secondary electron is coincide with the trajectory 40 of the high-angle component of the backscattering electron, the separation of the secondary electron and the backscattering electron becomes impossible.

On the other hand, a backscattering electron collided to the left reflector 36 and right reflector 37 generates a re-emission secondary electron 41. The re-emission secondary electron 41 is detected by both the left detector 42 and right detector 43. Part of the re-emission secondary electron 41 is attracted by the electrode 35 and may therefore not be detected.

In a conventional electron optical system, a secondary particle that lost the high-elevation angle component 40 of a backscattering electron and part of the re-emission secondary electron 41 finally reaches to each detector. As a result, a shadow contrast of an image which is formed based on signals sent from the left and right detectors 42 and 43 cannot be enhanced.

FIG. 5 shows the trajectory of a secondary particle in an electron optical system equipped with separation means for the high-velocity component and a low-velocity component of a secondary particle, more particularly, equipped with a trajectory separating means for a secondary electron and the backscattering electron. In a description of FIG. 5, the components having a same function as in FIG. 4 will be omitted. In the electron optical system shown in FIG. 5, as the trajectory separating means for the secondary electron and the backscattering electron, an assist electrode 50 surrounding annularly the optical axis 59 of a primary electron beam is interposed between magnetic/electrostatic compound objective lens 51 and a pair of left and right reflectors 52 and 53. A voltage approximately identical to the potential at the left and right reflectors 52 and 53 is applied to the assist electrode. Preferably, a voltage difference or a voltage fluctuation among the left reflector 52, right reflector 53 and the assist electrode 50 is retained within a range of ±100V. The assist electrode 50 is formed with a conductive plate having an opening through which a primary beam passes. The upper limit of detectable elevation angles at a generational position of a backscattering electron is restricted by a size of an opening formed on the optical axis between the left and right reflectors 52 and 53. Herein, when the edge of the opening of the assist electrode is tapered, an adverse effect of the assist electrode 50 on an electron beam (an electrostatic lens effect in the opening) is reduced, so that the efficiency of focusing by the objective lens is improved.

A secondary particle generated from irradiation of a primary beam is accelerated upward (in a direction opposite to an incident direction of a primary beam) by an electrode on the bottom of an objective lens. In the electron optical system shown in FIG. 5, a deceleration electric field with respect to the Z direction is applied to the secondary particle that passed through the objective lens, by the assist electrode. At this time, a velocity component of a backscattering electron propagating on an XY plane is not decelerated. Consequently, a high-angle component 56 of the backscattering electron sufficiently spreads to lateral direction before reaching the opening between the reflectors, hence the trajectories of the low-angle and high-angle components of the backscattering electron and secondary electrode are separated from each other. Similarly, the trajectory of the low-angle component of the backscattering electron spreads on the XY plane by the affection of the deceleration electric field with respect to the Z direction. Eventually, the low-angle component of the backscattering electron reaches to the reflectors in a condition separated from the high-angle component of the backscattering electron. On the other hand, the velocity component of the secondary electrode directed propagating on the XY plane is so small that it hardly spread laterally before reaching the opening between the reflectors.

Incidentally, the lateral spread of a backscattering electron can be controlled by increasing or decreasing a Z-direction deceleration electric field to be applied to a component of secondary particle that propagates in a Z direction. Consequently, the number of components of a backscattering electron that pass through the opening between the reflectors can be controlled by a voltage applied to the assist electrode 50. Therefore, the installation of the assist electrode 50 enables to control even a ratio of separation of the secondary electron and the backscattering electron each other. As mentioned above, in the electron optical system shown in FIG. 5, the number of the backscattering electron detected by the left detector 57 and right detector 58 increases by the lost amount of components since the coincidence with the secondary electrons in the electron optical system shown in FIG. 4. Thus, a shadow contrast is enhanced.

In the present example, although a pair of left and right reflectors 52 and 53 is disposed symmetrically with respect to the optical axis of a primary beam, the reflectors can be arranged in a way that the azimuth angle components are separated into two or more components. Further, although the description mentioned above is carried on a example where the objective lens is of magnetic/electrostatic compound objective lens, the principle is the same as that described so far even other type of electromagnetic lens is adopted.

According to the present invention, an image having a shadow contrast thereof enhanced can be produced during inspection of a semiconductor device or the line having a circuit pattern. A shallow roughness can be highly sensitively detected.

BRIEF DESCRIPTION OF THE DRAWINGS

These and other features, objects and advantages of the present invention will become more apparent from the following description when taken in conjunction with the accompanying drawings wherein:

FIG. 8A and FIG. 8B show effects of an assist electrode;

FIG. 15A and FIG. 15B show the structures of a power control table and a lens control table employed in the fourth embodiment.

DESCRIPTION OF THE PREFERRED EMBODIMENTS

First Embodiment

As the first embodiment, an adaptation to a scanning electron microscope will be described below.

Figure 6:
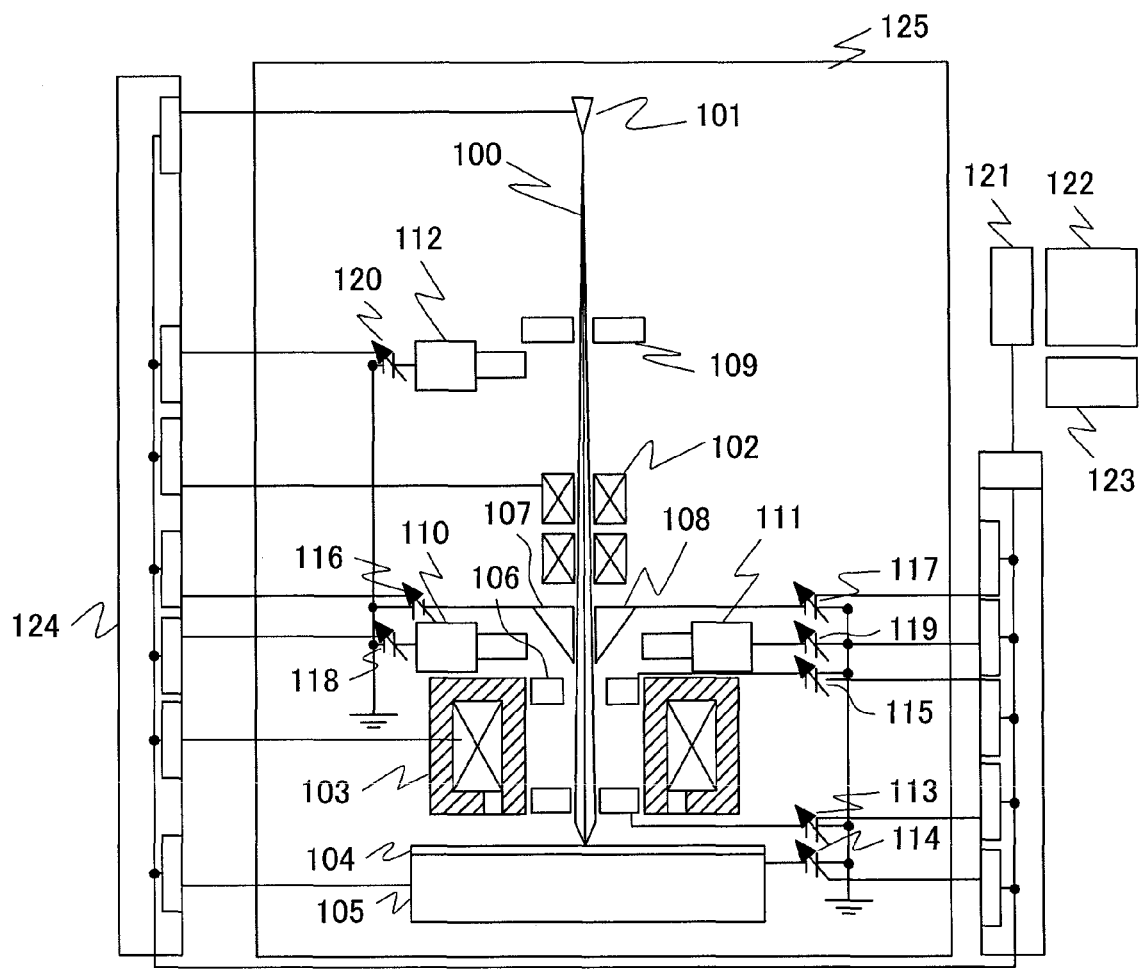
FIG. 6 shows the internal configuration of an electron beam apparatus in accordance with the first embodiment.

FIG. 6 shows the fundamental configuration of a charged-particle beam apparatus in accordance with the first embodiment. The charged-particle beam apparatus in accordance with the present embodiment includes: an electron optical system formed in a vacuum housing 125; an electron optical system control apparatus 124 disposed in a peripheral of the charged-particle beam apparatus; a host computer 121 that controls individual control units included in the control apparatus 124 and supervises the entire charged-particle beam apparatus; an operating console 122 connected to the control apparatus; and a display 123 including a monitor on which an acquired image is displayed. The electron optical system control apparatus 124 includes a power supply unit that feeds a current or a voltage to the elements constituting the electron optical system, and signal control lines over which a control signal is transmitted to each of the elements.

The electron optical system includes: an electron gun 101 that generates an electron beam (primary charged-particle beam) 100; a deflector 102 that deflects the electron beam 100; immersion objective lens 103 that converges the electron beam 100; an assist electrode 106 that converges or diverges a secondary particle emitted from a sample 104 retained on a stage 105; a reflecting member to which the secondary particle collides; and a left detector 110, a right detector 111, and a center detector 112 that detect an incidental (ternary) particle re-emitted due to the collision. The assist electrode 106 is located approximately same position with the top of the immersion objective lens 103. Moreover, the reflecting member is divided into a lower reflecting member disposed between the objective lens 103 and a scan coil 102, and an upper reflecting member disposed between the electron gun 101 and scan coil 102. The lower reflecting member is made of a conical metal member. In a conical surface of the conical metal member, a left collision surface 107 and a right collision surface 108 to which a secondary particle collides are formed. The upper reflecting member is made of a disk-like metal member having a primary beam passage opening formed therein. The bottom of the upper reflecting member constitutes a secondary particle reflecting surface 109.

The electron beam 100 emitted from the electron gun 101 is accelerated due to a potential difference formed between a lead electrode and an acceleration electrode (which are not shown but are elements including the electron gun), and reaches the immersion objective lens 103. To the lower electrode included in the immersion objective lens 103, a voltage causing a potential difference to the potential at the acceleration electrode to be positive is applied. The electron beam 100 passes the lower electrode while being accelerated due to the potential difference between the acceleration electrode and the lower electrode. On the other hand, a voltage causing a potential difference from the potential at the lower electrode to be negative is applied from a stage power supply 114 to the stage 105. The electron beam 100 having passed the lower electrode is rapidly decelerated and reaches a sample surface as a primary beam. Since a secondary particle generated from irradiation of the primary beam has a negative polarity, the secondary particle is accelerated due to a potential difference between the sample surface and the lower electrode, and reaches the top of the immersion objective lens 103.

In the vicinity of the assist electrode 106, a deceleration electric field that acts on a component of a secondary particle propagating in a Z direction is produced with a voltage applied from an assist electrode power supply 115. Consequently, a high-velocity component (backscattering electron) contained in the secondary particle and passed through the assist electrode 106 is separated from a low-velocity component contained in the secondary particle in its trajectory, and collides to the left collision surface 107 and right collision surface 108 of the reflecting member. To the left collision surface 107 and right collision surface 108, a voltage to generate an electric field for introducing a ternary particle generated by collision of the high-velocity component of the secondary particle is supplied from a left power supply 116 and a right power supply 117. Furthermore, a voltage to generate a electric field for the intake of the introduced backscattering electron is supplied to the left detector 110 or right detector 111 from a left detector power supply 118 or a right detector power supply 119.

A secondary particle from which the backscattering electron (strictly speaking, a high-velocity component of a secondary particle) is separated reaches the upper reflecting member, and collides to the secondary particle collision surface 109 to generate a ternary particle. In a body of the center detector 112 disposed by the side of the upper reflecting member, a intaking electric field is induced by a center detector power supply 120. Under the strong electric field, a re-emitted ternary particle is take fined into the detector.

Owing to the foregoing fundamental configuration, the left and right detectors enables to distinctively detect a high-elevation angle component and a low-elevation angle component of the high-velocity component, and enables to acquire a contrast enhanced shadow image.

Next, a method of controlling a voltage to be applied to the assist electrode 106 will be described below. The scanning electron microscope in accordance with the present embodiment can be operated in two operating modes, that is, in an operating mode (observation mode) of displaying a roughness enhanced image of a sample surface, and an operating mode (inspection mode) of displaying a contrast enhanced image, of which the contrast is attributable to difference in the material of the sample surface.

Figure 7:
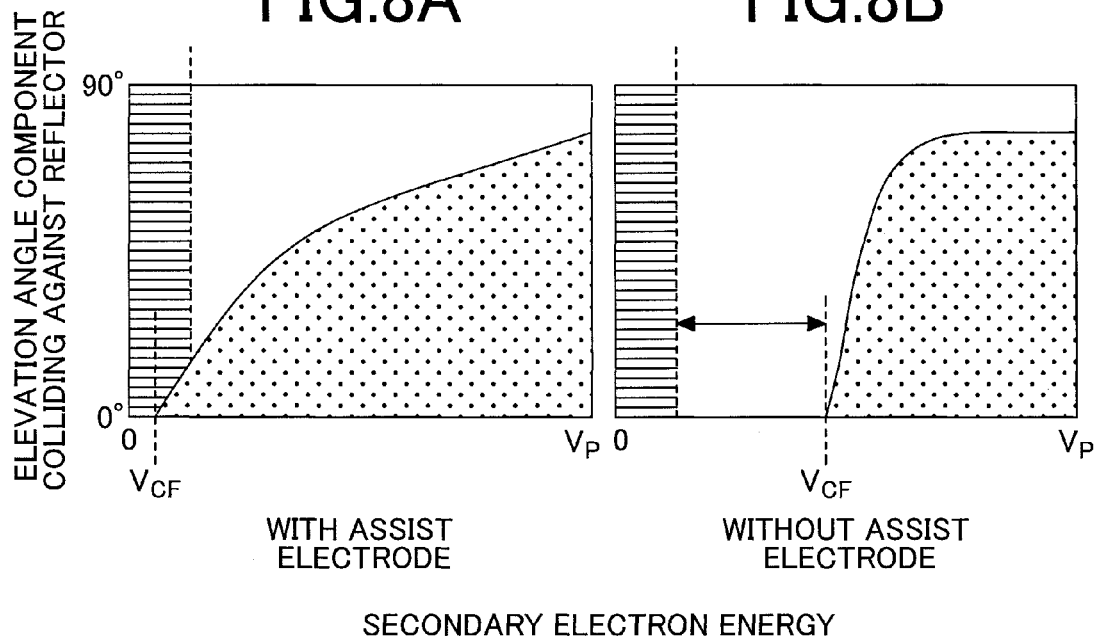
FIG. 7 shows the structure of a power control table relating to an assist electrode power supply and an objective-lens lower electrode control power supply.

On the display screen of the display 123, two selection buttons "Inspection Mode" and "Observation Mode" and a button "Discharge" are displayed. A user can select any of the buttons at the operating console 122. Host computer 121 stores information of voltages to be applied to the assist electrode 106 and the lower electrode of the objective lens respectively in accordance with each of the operating modes. FIG. 7 shows an instance of the configuration for controlling each of the operation modes using a data table storing the voltages corresponding to each operating mode. The data table shown in FIG. 7 is comprised of a beam mode selecting condition field in which index information corresponding to each operating mode is stored, and a voltage value field in which voltage values to be applied to the assist electrode 106 and the lower electrode of the objective lens are stored. The beam mode selecting condition field is further divided into a major category field and a minor category field, and index information corresponding to the "inspection mode", "observation mode" and a "normal mode" or a "charge mode" are stored. In the voltage value field, voltage values to be applied to the assist electrode 106 and the objective-lens lower electrode corresponding to conditions configured to the combination of the index information stored in the major category field and minor category field.

When a user selects the Inspection Mode button, the host computer 121 controls the transfer of signals in the electron optical system control apparatus 124, and reads out a detection signal sent from the center detector 112. The host computer 121 includes an image processing unit, and uses the detection signal sent from the center detector 112 to form an image based on a low-velocity component of a secondary particle. The formed image is displayed on the display 123. When the user selects the observation mode, the host computer 121 reads a detection signal sent from the left detector 110 or right detector 111, executes image formation, and displays an image based on a high-velocity component of the secondary particle. When the sample is charged, a luminance spot (shading) may appear in a displayed image. The shading occurs when the arrangement of an annular detector is deviated from the axially symmetry with respect to the trajectory of a secondary particle. On the other hand, in the configuration of the apparatus in accordance with the present embodiment, a secondary particle detector is disposed axially symmetrically with respect to the optical axis of a primary electron beam in order to separate an azimuth component from the secondary particle. When a sample is charged, the axis of the trajectory of the secondary particle may be relatively deviated from the center axis of the detector. On this occasion, the shading occurs.

When shading occurs, the operating modes of the apparatus are switched to select the discharge mode. Thus, the shading can be removed. When the user depresses the Discharge button, the voltages to be applied to the assist electrode 106 and the object-lens lower electrode are re-designated according to the table shown in FIG. 7. Consequently, a secondary particle detecting condition associated with the charged state of a sample is established, and an image of the shading removed can be obtained.

The aforesaid configuration is the minimal configuration of a charged-particle beam apparatus in which the present embodiment is implemented. For example, even when a condenser lens that helps focus an electronic beam or a Faraday cup that measures a beam current is included, the constituent feature of the present embodiment can be realized. Moreover, the deflector generally falls into an electrostatic type and an electromagnetic type. When multiple azimuth components at a generational position of a secondary particle from which the secondary particle is emitted are separated from each other, the left reflector and right reflector may each be divided into multiple reflectors. New detectors may be included in association with the respective reflectors.

By providing a condenser lens between the electron gun 101 and secondary particle reflecting surface 109, the focus of an electron beam is improved. Moreover, by employing two condenser lenses in two stage and providing an aperture for limiting a beam current in the two condenser lenses, the beam current and an aperture angle at the objective lens can be controlled independently, helping the focus of the electron beam.

FIG. 8A and FIG. 8B show energy distributions of elevation-angle components of a secondary particle detected by the left detector 110 in comparison with a presence of the assist electrode and an absence of the assist electrode. In the graphs, the vertical axis indicates the elevation angles exhibited by the elevation-angle component of a secondary particle collided to the left reflector, ranging from 0° to 90°. The horizontal axis indicates the energy of a secondary electron ranging from 0 to the same level of the energy of an primary electron beam (Vp). In the graphs, a portion hatched with dots indicates a domain representing a component of a secondary particle that collides to the left reflector. A portion hatched with stripes indicates a domain of energy representing a low-velocity component of the secondary particle termed in the present embodiment. $V_{CF}$ denotes the lowest energy exhibited by a high-velocity component of the secondary particle.

In a case of an absent of an assist electrode (FIG. 8A), the lowest energy $V_{CF}$ exists within a low-velocity component domain. This signifies that a low-energy component of a secondary particle is detected by the lower detector, which should be detected by the upper detector. On the other hand, in a case of an presence of the assist electrode (FIG. 8B), the lowest energy $V_{CF}$ exists away from the low-velocity component domain. This signifies that a low-velocity component is not mixed in a component of the secondary particle detected by the lower detector.

The configuration described in the present embodiment realizes an electron optical system, in which a degree of separation of a high-velocity component of a secondary particle and a low-velocity component is improved compared to conventional electron optical system. The advantage is especially remarkable in a case where the electron optical system is adapted to a defect inspection apparatus or a critical dimension measurement apparatus utilizing a scanning electron microscope.

Second Embodiment

Figure 9:
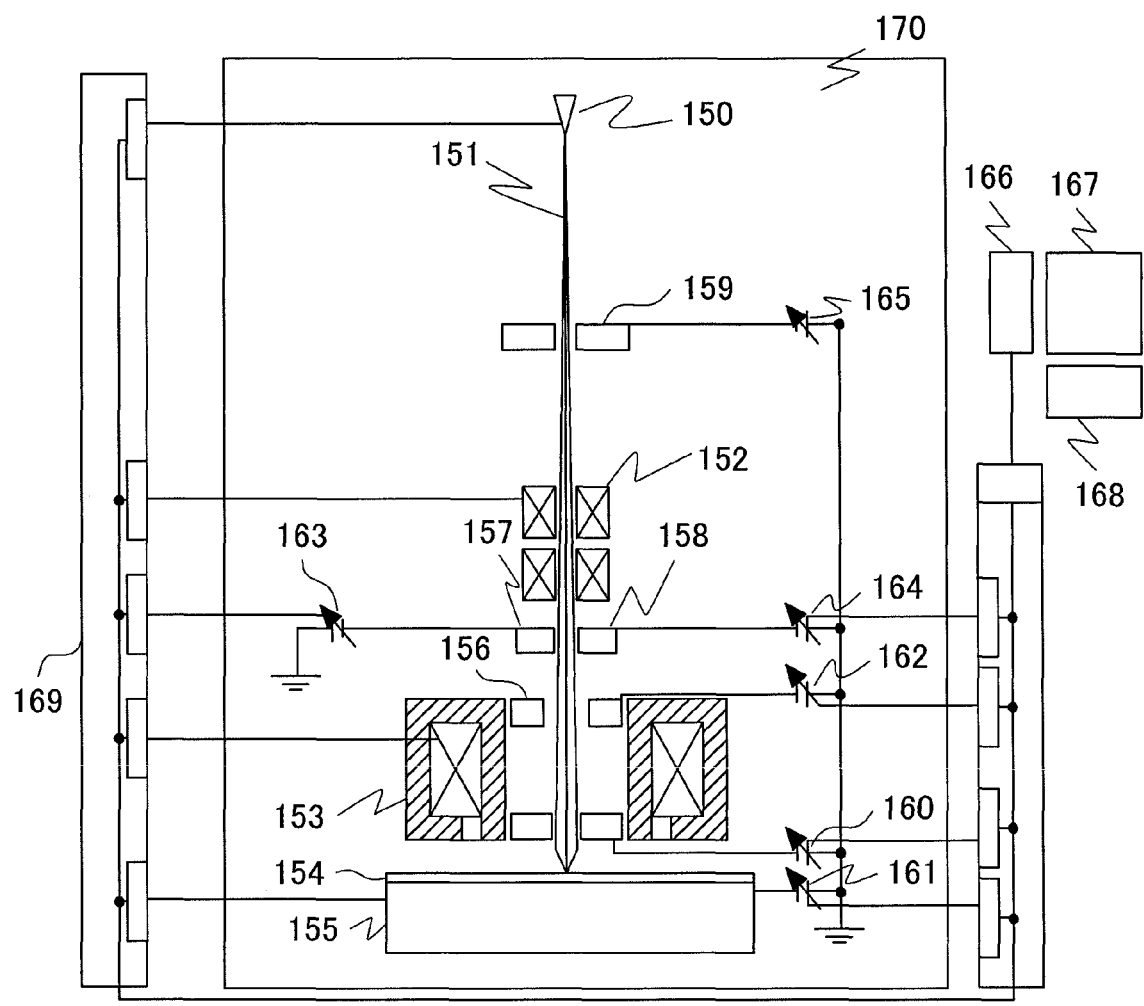
FIG. 9 shows the internal configuration of an electron beam apparatus in accordance with the second embodiment.

FIG. 9 shows the fundamental configuration of a charged-particle beam apparatus in accordance with the second embodiment. The charged-particle beam apparatus in accordance with the present embodiment has a configuration devoid of a reflecting member, and is intended to realize the same constituent feature as that of the configuration described in relation to the first embodiment despite a simpler configuration. The components of the apparatus will be described in conjunction with FIG. 9. However, as to the components whose operation, function, or arrangement are identical to those of the components included in the first embodiment, the explanation is omitted.

The charged-particle beam apparatus in accordance with the present embodiment includes an electron optical system formed in a vacuum housing 170, an electron optical system control apparatus 169, a host computer 166 that supervises the entire apparatus, an operating console 167 connected to the control apparatus, a display 168 including a monitor on which an acquired image is displayed, and a stage 155. The electron optical system control apparatus 169 includes a power supply unit that feeds a current or a voltage the elements constituting the electron optical system, and signal control lines over which a control signal is transmitted to each of the elements. The electron optical system includes an electron gun 151 that produces an electron beam 150, a scan coil 152 that sweeps an electron beam over a sample 154, immersion objective lens 153, an assist electrode 156 that focuses or disperses a secondary particle which is emitted from the sample 154, and a left detector 157, a right detector 158, and a center detector 159 to which a secondary particle collides.

The immersion objective lens 153 includes magnetic poles to be used to leak a magnetic field along the optical axis of a primary beam, an excitation coil for inducing a magnetic field around the magnetic poles, and a lower electrode disposed on the bottom of the objective lens. A voltage is applied from an electrode power supply 160 to the lower electrode. Due to an electric field induced with the application, an electron beam 150 and a secondary particle are accelerated. A retarding voltage is applied from a stage power supply 161 to the stage 155. The secondary particle is accelerated by the voltage. An assist electrode power supply 162 feeds a voltage, which is used to induce a backscattering electron deceleration electric field, to the assist electrode 156. A left detector power supply 163, a right detector power supply 164, and a center detector power supply 165 are used to take in a secondary particle to the left detector 157, right detector 158, and center detector 159 respectively. Since the apparatus in accordance with the present embodiment does not include a reflecting member, the apparatus is devoid of the left collision surface 107 and right collision surface 108 that are included in the apparatus in accordance with the first embodiment. Therefore, the potentials at the left detector 157 and right detector 158 get relatively higher than those in the apparatus in accordance with the first embodiment. Consequently, the absolute value of the potential at the assist electrode 156 has to be higher than that in the apparatus in accordance with the first embodiment.

Owing to the foregoing fundamental configuration, the left detector and right detector make it possible to selectively detect a velocity component of a secondary particle and an azimuth component thereof at a generational position at or from which the secondary particle is generated or emitted, and to acquire a shadow image having a contrast thereof enhanced.

The fundamental configuration is the minimal configuration of a charged-particle beam apparatus in which the present embodiment is implemented. For example, even when a condenser lens that helps focus an electron beam or a Faraday cup that measures a beam current is included, the constituent feature of the present embodiment can be realized. As for the deflector, an electrostatic type is easier to use than an electromagnetic type is. Since the electrostatic type is compact and little affects the trajectory of a secondary particle, the detectors can be easily disposed on the side of the electron gun on which there is much room. In order to detect or select multiple azimuth components of a secondary particle at the generational position of the secondary particle, each of the left detector and right detector may be divided into multiple detectors.

Third Embodiment

Figure 10:
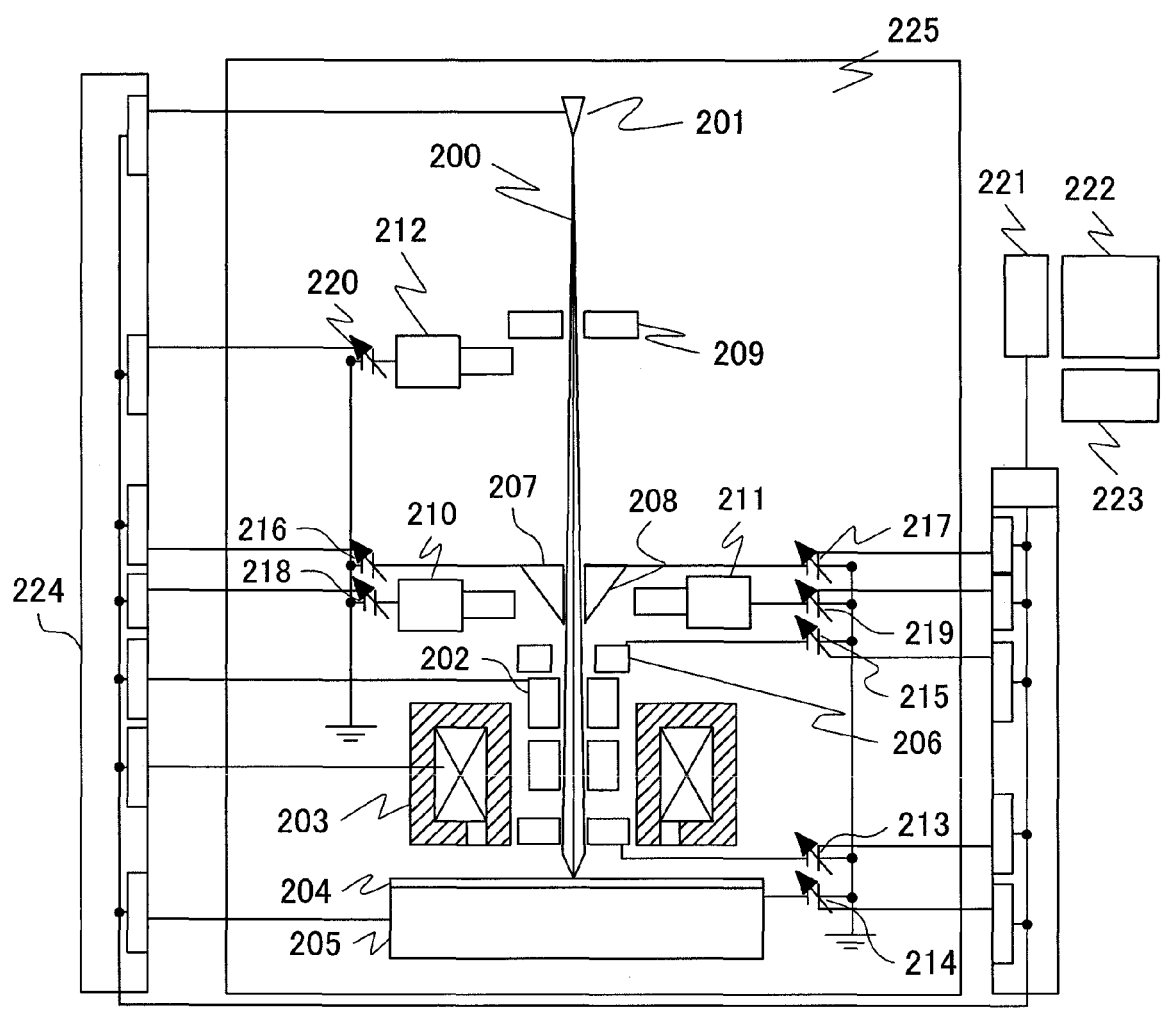
FIG. 10 shows the internal configuration of an electron beam apparatus in accordance with the third embodiment.

FIG. 10 shows the fundamental configuration of a charged-particle beam apparatus in accordance with the third embodiment of the present invention. The charged-particle beam apparatus in accordance with the present invention includes, in addition to a reflecting member, an ExB deflector. As a trajectory separating means of a secondary electron from the trajectory of a backscattering electron, magnetic poles are substituted for the assist electrode. Referring to FIG. 10, the components of the apparatus will be described below. However, a description of the components whose actions, capabilities, or dispositions are identical to those of the components included in the first embodiment will be omitted.

The charged-particle beam apparatus in accordance with the present embodiment includes an electron optical system formed in a vacuum housing 225, an electron optical system control apparatus 224, a host computer 221 that controls the whole of the apparatus on a centralized manner, an operating console 222 connected to the control apparatus, a display 223 including a monitor on which an acquired image is displayed, and a stage 205. The electron optical system control apparatus 224 includes a power supply unit that feeds a current or a voltage to the elements constituting the electron optical system, and signal control lines over which a control signal is transmitted to each of the elements. The electron optical system includes: an electron gun 201 that produces a primary electron beam 200; an ExB deflector (Wien filter) 202 that separates a secondary particle, which is generated from irradiation of a primary beam, from the primary beam; immersion objective lens 203; an assistant magnetic field application device 206 interposed between the lower electrode of the immersion objective lens 203 and the ExB deflector 202; a first-stage reflecting member including a left collision surface 207 and a right collision surface 208 to which a secondary particle collides; a lower detector including a left detector 210 and a right detector 211 that detect a ternary particle which is generated by the secondary particle colliding to the reflecting member; a second-stage reflecting member 209 interposed between the first-stage reflecting member and electron gun; and an upper detector 212. Incidentally, the electron optical system shown in FIG. 10 includes a scan coil that sweeps a primary beam 200, even though the scan coil is not shown.

Power to be used to induce a ternary particle introduction electric field is fed from a left power supply 216 and a right power supply 217 to the left collision surface 207 and right collision surface 208 of the first-stage reflecting member respectively. To the upper detector and lower detector, power for forming an electric field used to take in a ternary particle is fed from a left detector power supply 218, a right detector power supply 219, and a center detector power supply 220 respectively.

Power to be used to induce an acceleration electric field under which the electronic beam 200 and a secondary particle are accelerated is fed from an electrode power supply 213 to the lower electrode of the immersion objective lens 203. Power to be used to induce a retarding electric field is fed from a stage power supply 214 to the stage 205.

The assistant magnetic field application apparatus 206 includes magnetic poles made of a soft magnetic material and a coil. An excitation current that flows through the coil is fed from an assistant magnetic field power supply 215. A backscattering electron is bent using a magnetic field induced around the right and left magnetic poles, whereby the trajectory of the backscattering electron is separated from that of a secondary electron. The employment of the magnetic field makes it possible to directly accelerate a velocity component propagating on an XY plane. Consequently, separation from the trajectory of the secondary electron can be achieved efficiently.

Owing to the fundamental configuration, the left detector 210 and right detector 211 make it possible to selectively detect a velocity component and an azimuth component at a generational position at or from which a secondary particle is generated or emitted, and to acquire a shadow image having a contrast thereof enhanced.

Fourth Embodiment

The present embodiment will be described by taking the configuration of a defect review inspection apparatus for instance. Many defect review apparatuses have a drawback that shading stems from charging of a sample. In relation to the present embodiment, a cause of shading will be described first.

Figure 11:
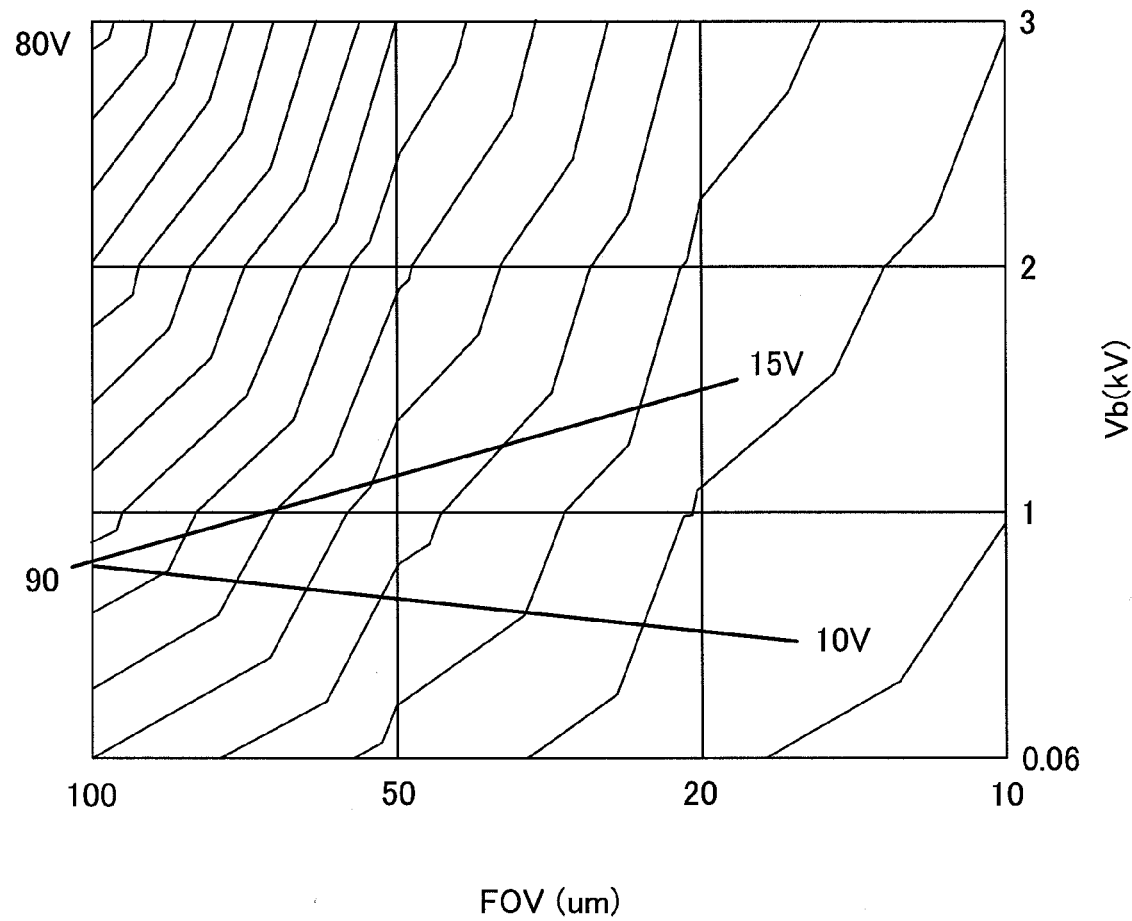
FIG. 11 shows a correlation among a range scanned with a primary beam, a voltage applied to an objective-lens lower electrode, and a degree of charging to which a sample is charged.

To begin with, referring to FIG. 11, the relationship between charging of a sample and shading will be described. FIG. 11 shows a degree of charging in a situation that an insulating sample is irradiated with an electron beam having a beam current retained at a certain value. The vertical axis indicates values of a voltage Vb (kV) applied to the lower electrode included in the immersion objective lens, and the horizontal axis indicates a length FOV (μm) of a range to be scanned with an electron beam. The degree of charging is indicated with a height represented by a contour line 93. In the immersion objective lens, the higher an electrode voltage is, the higher a resolution is obtained, however, the degree of charging increases. As the degree of charging increases, a drawback such as destruction of a sample or shading attributable to a shift of the trajectory of a secondary electron takes place. In order to avoid the drawback, it is necessary to appropriately control an electrode voltage in the immersion objective lens. Along with a change in the electrode voltage in the objective lens, the trajectory of a secondary electron changes from one to another. In order to prevent a contrast of a shadow image from being degraded, trajectory separating means have to be controlled at the same time when the electrode voltage in the objective lens is controlled.

Figure 1:
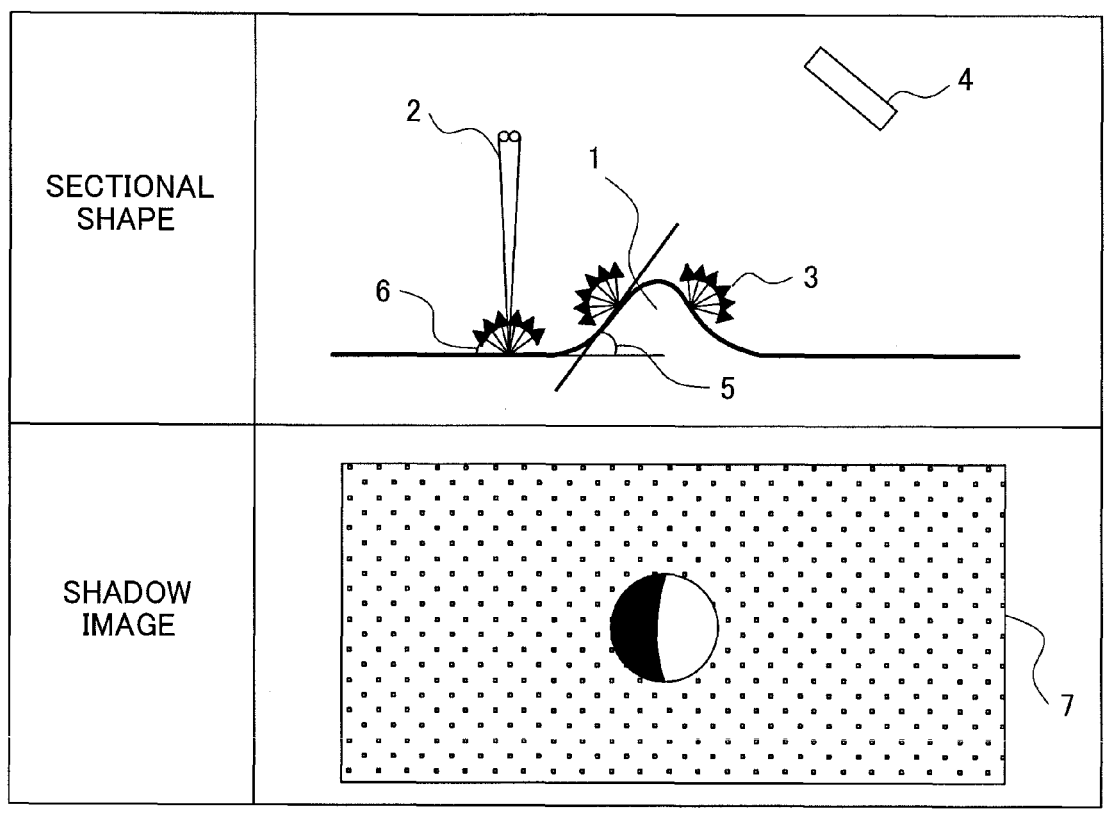
FIG. 1 is an explanatory diagram concerning a fundamental principle of generation of a shadow image.
Figure 2:
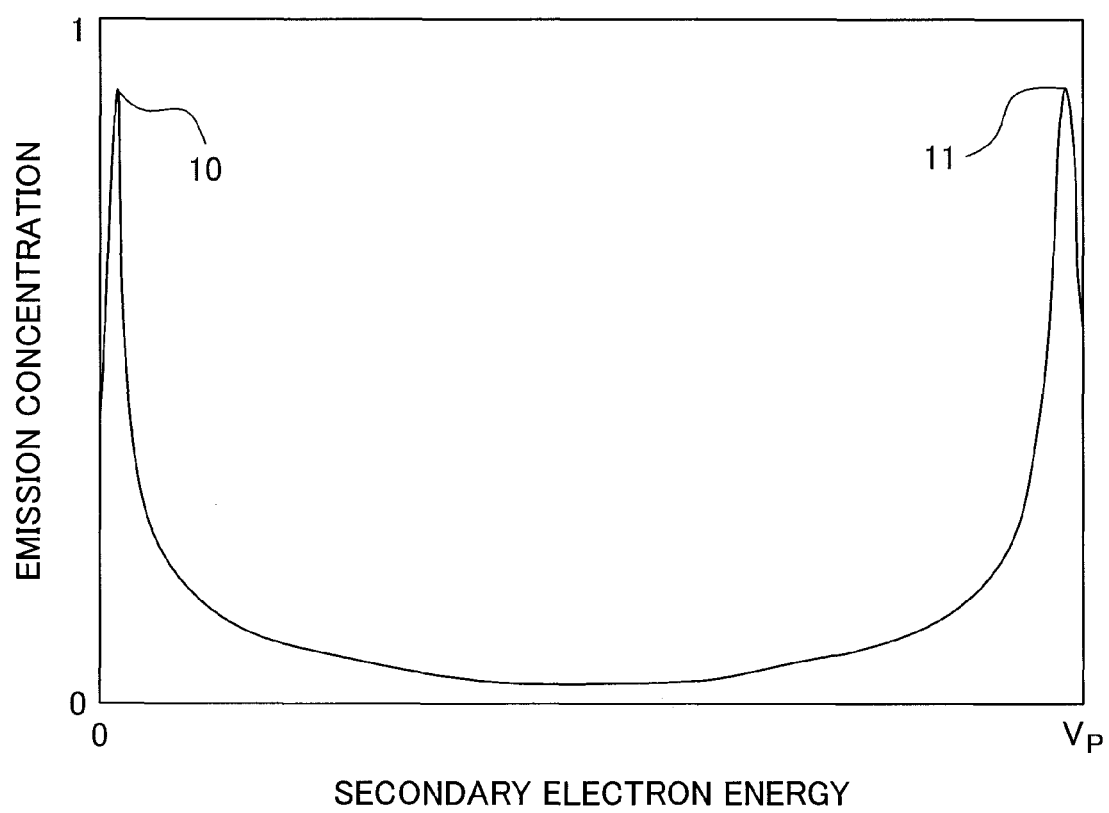
FIG. 2 shows the dependency of an emission concentration of a secondary particle on the energy of the secondary particle.
Figure 3:
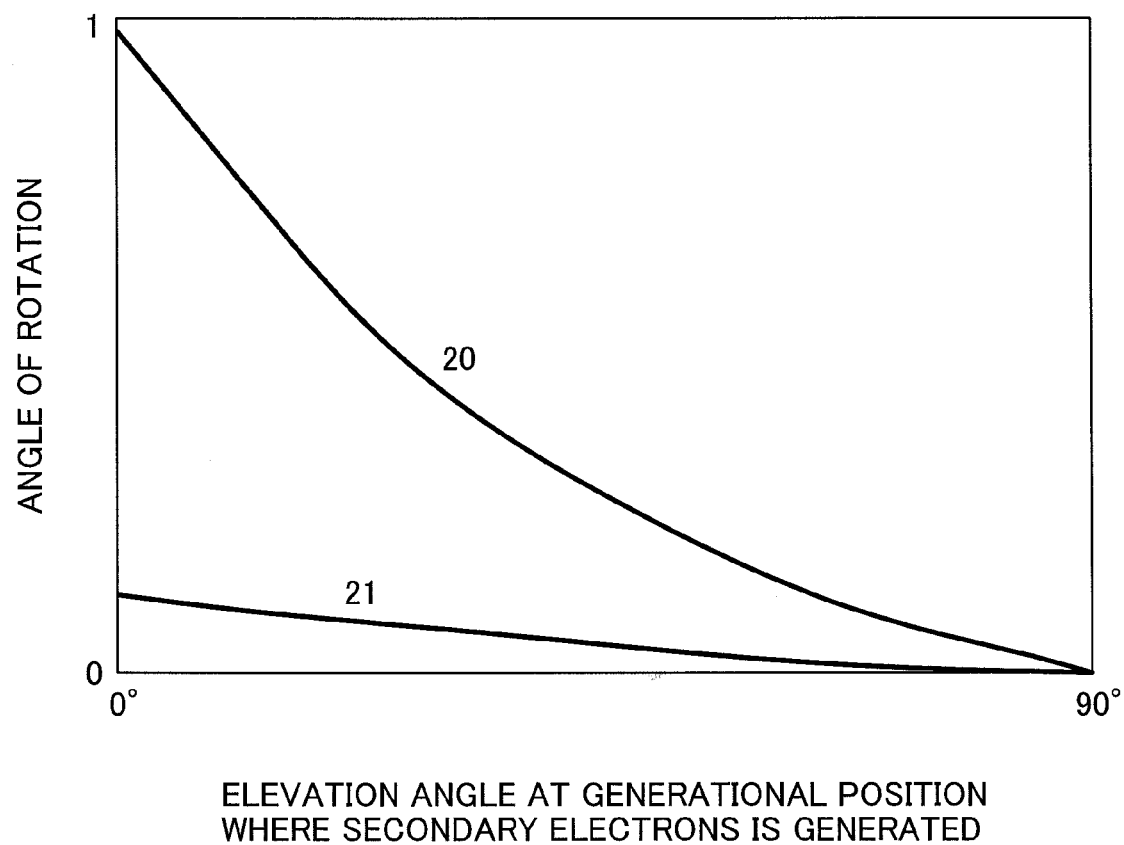
FIG. 3 shows the dependency of an rotational angle on an elevation angle at a generational position of a secondary particle.
Figure 4:
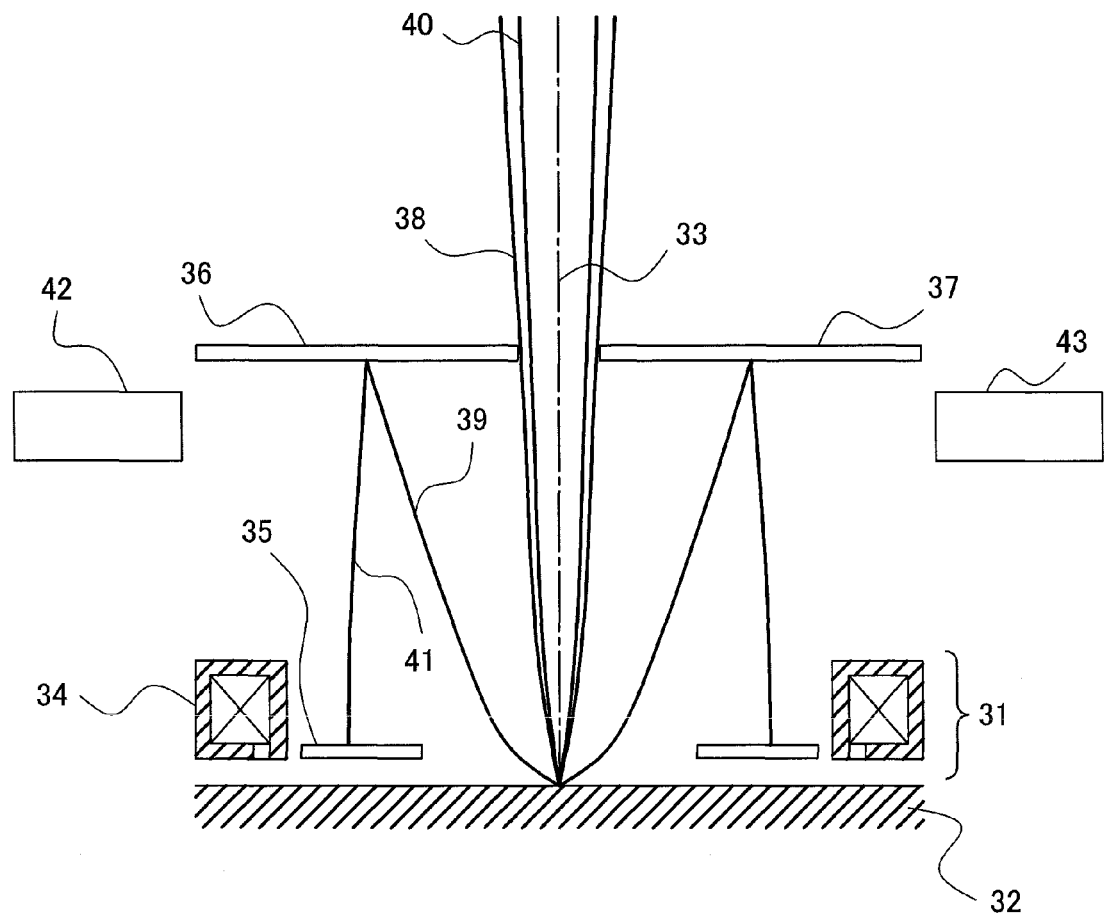
FIG. 4 shows the trajectories of components of a secondary particle in an electron optical column including magnetic/electrostatic compound objective lens.
Figure 5:
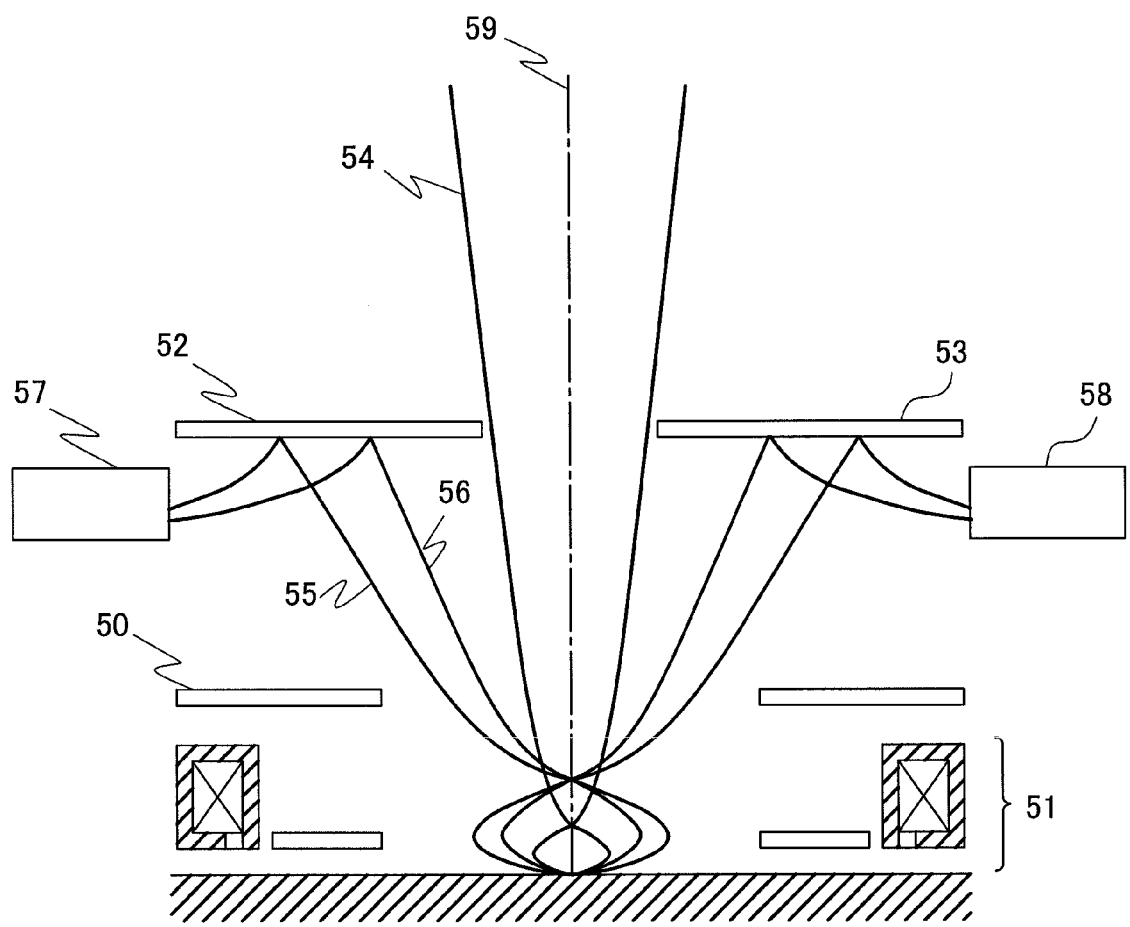
FIG. 5 shows the trajectories of components of a secondary particle in an electron optical column including an assist electrode.
Figure 12:
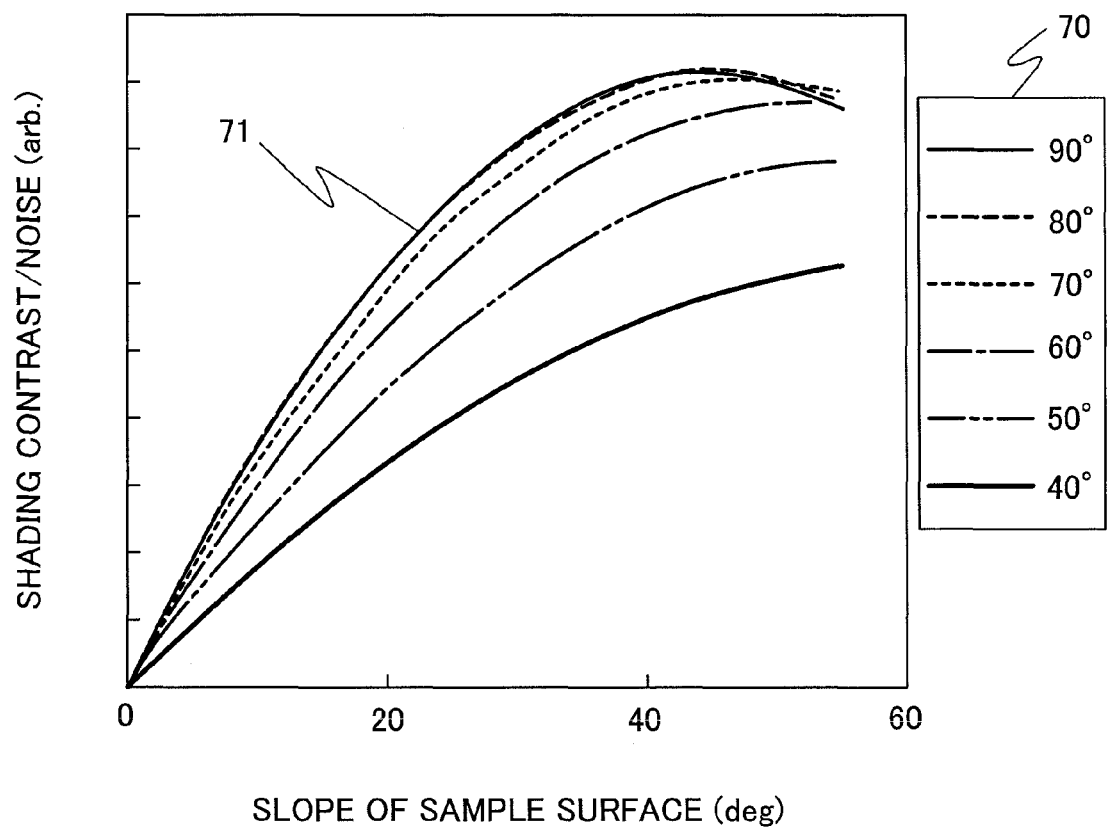
FIG. 12 shows the dependency of a shadow contrast-noise ratio on a slope of a sample surface.

Referring to FIG. 12, an elevation-angle component required for fear that a contrast of a shadow image may be degraded will be qualitatively described below. FIG. 12 shows the dependency of a shadow contrast on a slope. The vertical axis indicates normalized shadow contrast values, that is, a normalized intensity of a shadow contrast between a portion of a slope 5 (FIG. 1) in a sample surface and a flat portion of the sample surface, which is normalized with a value of noise contained in an electron beam image on the observation. The horizontal axis indicates the values of the slope 5 of the sample surface at a generational position due to the roughness caused by a foreign matter or as such. A legend 70 presents detectable upper limits of elevation angles at a generational position at which a backscattering electron is generated. A curve 71 that the upper limit is more than or equal 70° indicates relatively stronger shadow contrast than the other curves that the upper limits is less than 70°. On the other hand, the curves that the upper limits is equal to or larger than 70° are nearly coincidence with each other throughout the entire range of the graph. Consequently, by detecting the remaining 70° to 0° elevation-angle component of the backscattering electron, a qualified shadow contrast substantially equivalent to an ideal shadow contrast obtained in a situation that all the components of the backscattering electron are distinguished into right-side components and left-side components, even though the trajectories of the 90° to 70° elevation-angle component of a backscattering electron are coincidence to the trajectory of a secondary electron.

Figure 13:
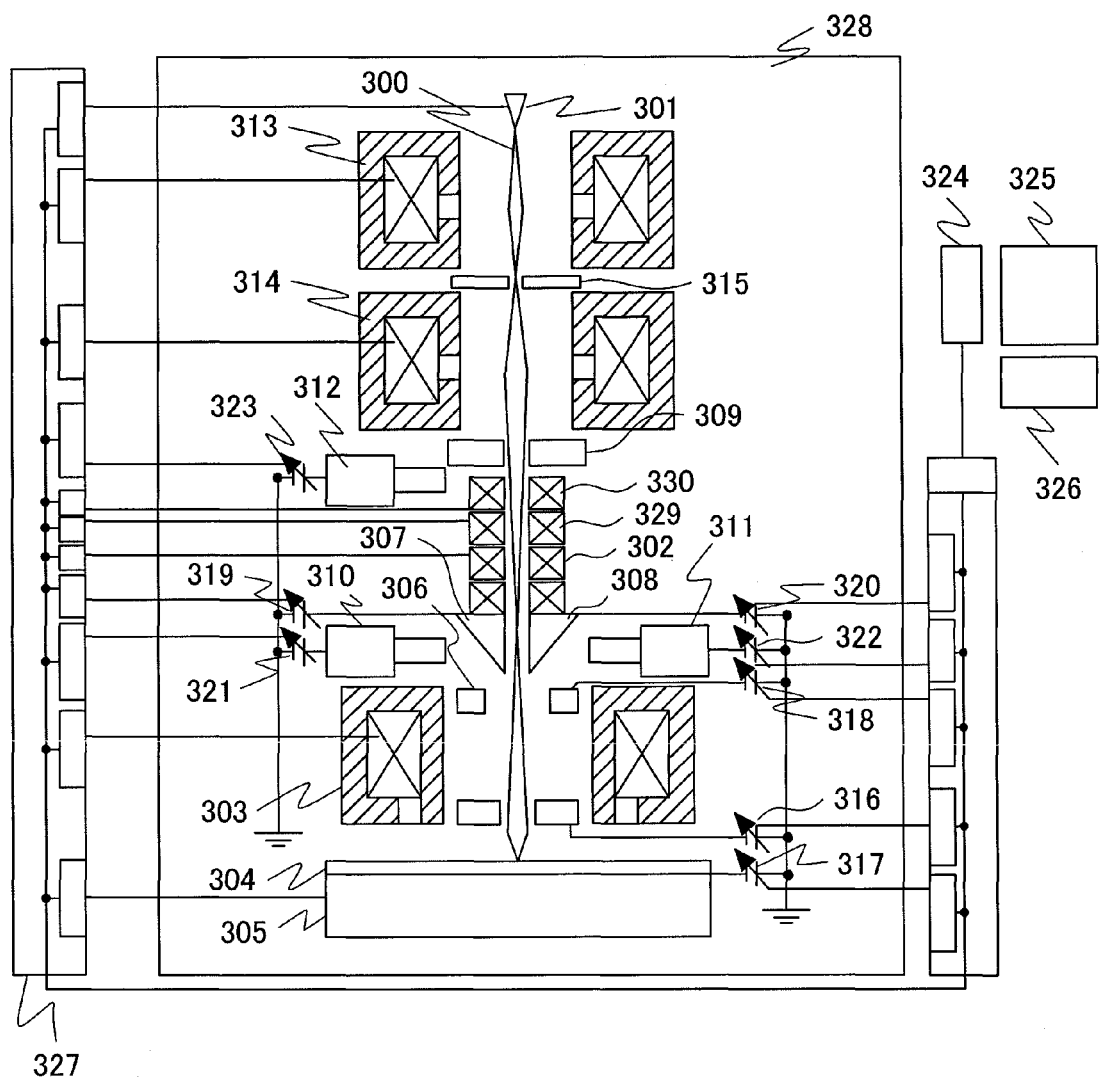
FIG. 13 shows the internal configuration of a scanning electron microscope included in a defect review apparatus in accordance with the fourth embodiment.
Figure 14:
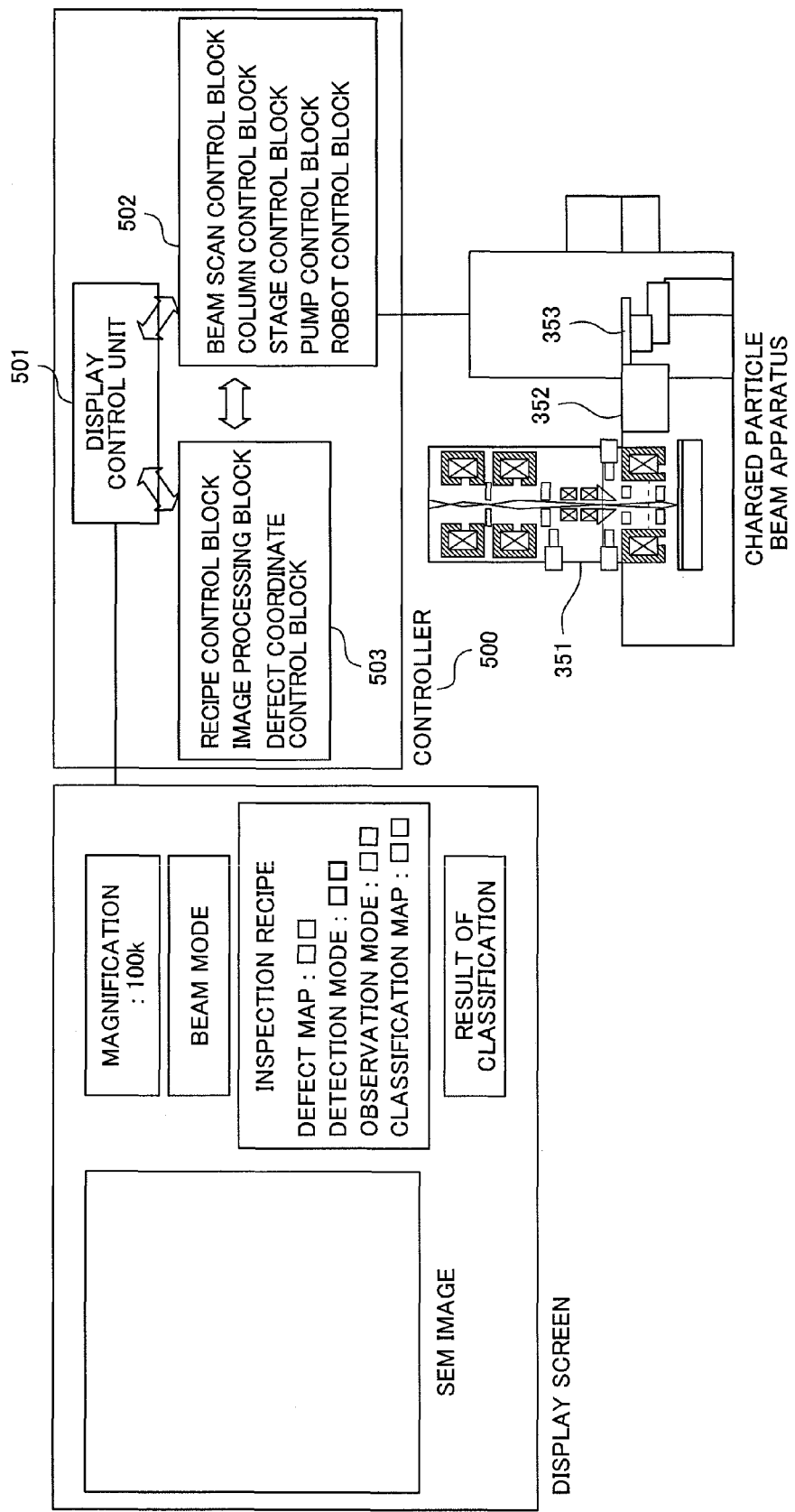
FIG. 14 shows the overall configuration of the defect review apparatus in accordance with the fourth embodiment.

Next, referring to FIG. 13 and FIG. 14, the internal elements constituting an electron optical system of a defect review inspection apparatus in accordance with the present embodiment and the overall configuration of the apparatus are explained. The charged-particle beam apparatus in accordance with the present embodiment includes: an electron optical system formed in a vacuum housing 328; an electron optical system control apparatus 327 disposed on the periphery of the housing; an information processing apparatus 324 that controls control units and a power unit included in the electron optical system control apparatus 327 and that controls the whole of the apparatus on a centralized manner; an operating console 325 connected to the control apparatus; a display 326 including a monitor on which an acquired image is displayed; and a stage 305 on which a sample 304 is retained. The electron optical system control apparatus 327 includes the power unit that feeds a current or a voltage to the elements of the electron optical system, and signal control lines over which a control signal is transmitted to each of the elements.

The electron optical system includes: an electron gun 301 that produces a primary electron beam 300; an ExB deflector (Wien filter) 302 that separates a secondary particle, which is generated from irradiation of the primary beam, from the primary beam; immersion objective lens 303 that focuses an electron beam 300; an assist electrode 306 located at a position nearly squared with the top of the immersion objective lens 303; a first reflecting member to which a secondary particle collides; a left detector 310 and a right detector 311 that detect an incidental (ternary) particle re-emitted due to the collision; a second reflecting member 309 located above the first reflecting member (on the side of an electron source); a center detector 312 that detects an incidental (ternary) particle produced from the secondary particle which has collided to the second reflecting member; a first condenser lens 313, a second condenser lens 314, a beam limiting aperture 315, a stigmator 329, and an aligner 330; a voltage feeding power supply 316 from which a voltage is applied to the lower electrode of the immersion objective lens 303; a retarding power supply 317 from which a retarding voltage is applied to the sample stage; an assist electrode power supply 318; a left power supply 319 and a right power supply 320 from which power to be used to induce a secondary particle introduction electric field is fed to the respective detectors; and a left detector power supply 321, a right detector power supply 322, and a center detector power supply 323. As the electron gun, a Schottky-type electron source, a cold field emission type electron source, or a thermoelectron emission type electron source may be adopted. The first reflecting member is formed with a conical metal member. On the conical surface of the first reflecting member, a left collision surface 307 and a right collision surface 308 to which a secondary particle collides are formed. The second reflecting member is formed with a disk-like metal member having an opening, through which a primary beam passes, formed therein, and the bottom surface of the second reflecting member constitutes a second particle reflecting surface 309. The reflecting member may be divided into multiple reflecting members, and detectors may be associated with the respective reflecting members. In this case, azimuth angle components of a secondary particle can be more finely discriminated from one another. Moreover, by employing the first condenser lens 313, second condenser lens 314, and beam limiting aperture 315, the control of the beam current is ensured. In the present embodiment, since the ExB deflector (Wien filter) 302 is included, a secondary particle can be efficiently collected. Further, by employing the beam limiting aperture 315 between the first condenser lens 313 and second condenser lens 314, the beam current and the spread of the primary electron beam 300 at the immersion objective lens 303 can be controlled independently of each other. Consequently, compared with the apparatuses of the other embodiments, the apparatus in accordance with the present embodiment can most efficiently focus the primary electron beam 300 in any range of the beam current.

FIG. 14 shows the overall configuration of a defect review system to which the present embodiment is adapted. The defect review system to which the present embodiment is adapted includes, in addition to the information processing apparatus 324 and a display 326, an electron optical column 351 that irradiates a charged-particle beam to a sample substrate that is a sample to be inspected and detects a secondary-particle signal or a two-dimensional intensity distribution based on the secondary-particle signal, a main chamber in which sample substrates are stored, a load-lock chamber 352 used to carry each sample substrate into or out of the main member, a sample substrate casing in which each sample substrate is stored, and a robot 353 that transports each sample substrate from the sample substrate casing to the load-lock member. Thus, the sample substrates in the main member can be automatically exchanged.

A control apparatus 500 includes functional units, such as; a display control unit 501, an electron microscope control unit 502 that controls the components of the electron microscope, and a display data computation unit 503 that computes various display data items to be handled by the display control unit 501.

The electron microscope control unit 502 further includes such functional blocks as a beam sweep control block, a column control block, a stage control block, a vacuum pump control block, and a robot control block. The beam sweep control block controls sweeping of a beam by the electron optical column and acquires a signal. Moreover, the beam sweep control block, column control block, and stage control block execute their control sequences synchronously with one another until the control sequences end with completion of inspection. The display data computation unit 503 includes: a recipe control block that runs a graphical user interface (GUI) for a recipe screen image; an image processing block that performs computations including image comparison and image analysis so as to execute formation of a high-resolution observation image expressing a defect, extraction of a defect or a foreign matter, classification of a defect, or any other inspectional processing; and a defect coordinate control block that determines a position, to which a primary electron beam is irradiated, on the basis of defect position data which is obtained through defect coordinate sampling performed by the image processing block or which is received from any other inspection apparatus, and transmits the position to the stage control block. The above functional blocks are implemented by processor included in the control apparatus 500, software run by the information processing means, memory in which the software is stored, means for issuing a control instruction, and means for receiving a signal.

An operator registers an inspection recipe of the inspection system to the recipe control block via the display control unit. Based on the inspection recipe, the recipe control block communicates at a high speed with the display control unit, image processing block, defect coordinate control block, beam sweep control block, column control block, stage control block, vacuum pump control block, and robot control block. The beam scan control block, column control block, stage control block, vacuum pump control block, and robot control block communicates a control signal and other signals to or from a charged-particle beam control apparatus. On the display screen of the display means 326, a formed image, an observational magnification selection button, a beam mode selection button, an inspection recipe, a result of classification of a defect, and other information are displayed. This enables the operator to select an observational magnification and a beam mode. Here, the "beam mode" means an irradiation condition of a primary electron beam in an inspection mode or an observation mode (to be described later), or in a normal mode or a discharge mode accompanying the inspection mode or the observation mode. Moreover, the inspection recipe is appropriately selected or constructed according to a purpose of an inspection. FIG. 14 shows an example in which a defect map display button, a detection mode/observation mode switching button, and a classification map display button are displayed on the display screen as a ticker for designating the inspection recipe. Herein, the detection mode and observation mode refer to an operating mode of the electron optical column in acquiring an observation image utilized for detecting a defect or a foreign matter, and an operating mode of the electron optical column in acquiring a finer observation image of the defect or foreign matter. Consequently, the operator can easily designate an inspection recipe and register the designated inspection recipe in the recipe control block. Moreover, the result of classification of a defect is displayed on the display screen so that the operator can collate a displayed defect image with the result of classification.

After the completion of the inspection based on the inspection recipe, the sample substrate is transported to the load-lock member, and carried out of the load-lock member and put in the casing by the robot. If necessary, transportation of the next sample substrate is initiated. The inspection recipe, observation image data, and result of classification are stored in the memory included in the information processing apparatus 324, and provided as inspection data whenever it is needed.

FIG. 15A shows a power control table specifying power control values corresponding to the elements of the electron optical system in each of the beam modes. Herein, the power values Vst, Vb, Vc, Vre, and Vsc are voltage values fed from the retarding power supply 317 (Vst), lower electrode power supply 316 (Vb), assist electrode power supply 318 (Vc), right and left reflecting member power supplies 320 and 319 (Vre), right and left detector power supplies 322 and 321 (Vsc), and center detector power supply 323 (Vsc), respectively. The power control table is stored in the information processing apparatus 324. When the operator selects a beam mode by manipulating the beam mode selection button displayed on the screen or the operating console 325, the computing means included in the information processing apparatus 324 refers the power control table and reads out the associated power control values. The read out control voltage values are transmitted to the electron optical system control apparatus 327. The power supplies are controlled based on the control voltage values. In a case of severe charging, the charge mode is selected. Particularly, low-magnification observation (a magnification in a situation that a scan range exceeds about 10 µl or more) in the inspection mode, a charging voltage is likely to get higher than that in the observation mode. The charge mode is therefore often adopted.

FIG. 15B shows a lens setting table in which lens setting values of the electron optical system corresponding to each of the beam modes are stored. Similarly to the power control table, the lens setting table is stored in the memory included in the information processing apparatus 324. When the beam modes are switched, the computing means refers the lens setting table and reads out control current values for the objective lens, stigmator, and aligner respectively. In a discharge mode utilized in an occurrence of the shading, setting values are selected in a manner that the potential difference between the voltages Vst and Vb and the potential difference between the voltages Vc and Vre are decreased. The read out control current values are transferred to the electron optical system control apparatus 327, then the elements constituting the electron optical system are controlled.

As mentioned above, according to the defect review apparatus of the present embodiment, a shadow contrast enhanced image can be acquired in the inspection of a semiconductor device having a circuit pattern or the like. A shallow roughness attributable to the very tiny foreign matter or the like can be detected with high sensitively. Consequently, the number of integration times of an image data for the assurance of image quality is decreased. Eventually, fast defect detection and defect review are realized without degradation of precision in defect detection. Further, the precision in defect classification improves, and a cause of a defect can be identified readily.

Although the present embodiment has been described on an instance of the defect review apparatus employing an electron beam, adaptation to a general charged-particle beam apparatus employing a charged-particle beam such as an ion beam is also effective.

Fifth Embodiment

Figure 16:
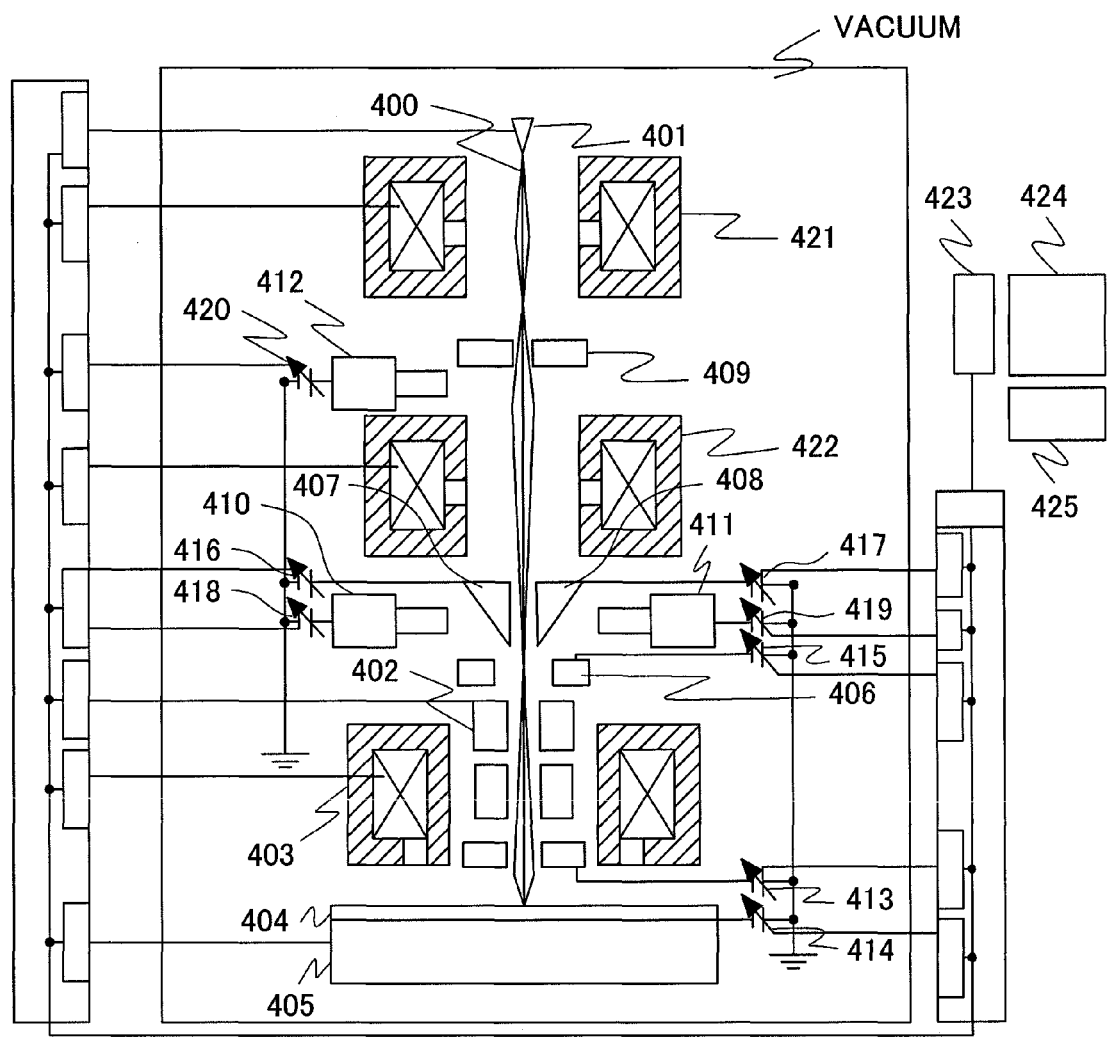
FIG. 16 shows the internal configuration of an electron beam apparatus in accordance with the fifth embodiment.

As the present invention, a variant of the electron optical system shown in FIG. 13 will be described below. FIG. 16 shows the fundamental configuration of a charged-particle beam apparatus in accordance with the fifth embodiment. A description of the capabilities or actions shared by the components shown in FIG. 13 will be omitted.

The charged-particle beam apparatus in accordance with the present embodiment includes: an electron gun 401 that produces an electron beam 400; a deflector 402 that deflects the electron beam 400; a first condenser lens 421, a second condenser lens 422, and immersion objective lens 403 that focus the electron beam 400; a stage 405 that moves a sample 404; an assist electrode 406 that focuses or disperses a secondary electron which is emitted from the sample 404; a left reflector 407, a right reflector 408, and a center reflector 409 to which a secondary electron collides; a left detector 410, a right detector 411, and a center detector 412 that detect a secondary electron re-emitted due to the collision; and a first condenser lens 421 and a second condenser lens 422.

In the immersion objective lens 403, the electron beam 400 and a secondary electron are accelerated by an electrode power supply 413. On the stage 405, the electron beam 400 is decelerated by a stage power supply 414 and the secondary electron is accelerated owing thereby. The assist electrode 406 focuses or disperses the secondary electron owing to an assist electrode power supply 415. The left reflector 407 introduces the secondary electron, which is re-emitted, to the left detector 410 owing to a left power supply 416. The right reflector 408 introduces the secondary electron to the right detector 411 owing to a right power supply 417. The left detector 410, right detector 411, and center detector 412 take in the secondary electron, which is re-emitted, using an intense electric field induced by a left detector power supply 418, a right detector power supply 419, and a center detector power supply 420 respectively.

Owing to the foregoing fundamental configuration, the left detector and right detector make it possible to selectively detect a velocity component of a secondary electron and an azimuth component thereof at a generational position at which the secondary electron is generated, and to acquire a shadow image whose contrast is enhanced. In the present embodiment, the center reflector 409 is interposed between the first condenser lens 421 and second condenser lens 422, and used as a beam limiting aperture for control of a beam current. Consequently, the number of microscopic holes through which the electron beam 400 passes can be decremented by one. The primary electron beam 300 can be most efficiently focused irrespective of a beam current.

What is claimed is:

1. An electron beam apparatus including an information processing apparatus, a display, an electron optical column that irradiates a charged-particle beam to a sample substrate which is a sample to be inspected and detects a secondary-particle signal or a two-dimensional intensity distribution based on the secondary-particle signal, a main chamber in which sample substrates are stored, a load-lock chamber used to carry each sample substrate into or out of the main chamber, and a robot which transports each sample substrate to the load-lock chamber and can automatically exchange the sample substrates:

the information processing apparatus comprising:
a display control unit;
an electron microscope control unit which has a beam scan control block, a column control block, a stage control block, a pump control block and a robot control block; and
a display data computation unit which has a recipe control block, a image processing block and a defect coordinate control block;
wherein the recipe control block communicates at a high speed with the display control unit, the image processing block, the defect coordinate control block, the beam scan control block, the column control block, the stage control block, the pump control block and the robot control block based on an inspection recipe registered via the display control unit; and
wherein the display has a screen for displaying and selecting a defect map, a classification map, a formed image, an observational magnification, an inspection mode which refers to an operating mode of the electron optical column in acquiring an observation image utilized for detecting a defect or a foreign matter, an observation mode which refers to an operating mode of the election optical column in acquiring a finer observation image of the defect or foreign matter, a normal mode or a charge mode which accompanies the inspection mode or the observation mode and is an irradiation condition of a primary electron beam, and displays a result of classification of a defect.

2. The electron beam apparatus according to claim 1, wherein the recipe control block comprises a beam mode selecting field in which index information corresponding to each operating mode is stored, a voltage value field in which voltage values to be applied to an assist electrode and a lower electrode of an objective lens are stored, wherein the beam mode selecting field is further divided into a major category field and a minor category field, and index information corresponding to the "inspection mode", "observation mode" and a "normal mode" or a "charge mode" are stored, and the voltage value field stores voltage values to be applied to the assist electrode and the lower electrode of the objective lens corresponding to conditions configured to a combination of the index information stored in a major category field and a minor category field.

\* \* \* \* \*